United States Patent
Tzeng (10) Patent No.: US 8,892,617 B2
(45) Date of Patent: Nov. 18, 2014

(54) JITTER GENERATOR FOR GENERATING JITTERED CLOCK SIGNAL

(75) Inventor: Tzu-Chien Tzeng, Hsin-Chu (TW)

(73) Assignee: Realtek Semiconductor Corp., Hsinchu (TW)

( * ) Notice: Subject to any disclaimer, the term of this patent is extended or adjusted under 35 U.S.C. 154(b) by 1396 days.

(21) Appl. No.: 12/324,887

(22) Filed: Nov. 27, 2008

(65) Prior Publication Data

US 2009/0134918 A1 May 28, 2009

(30) Foreign Application Priority Data

Nov. 28, 2007 (TW) .................................. 96145198 A (51) Int. Cl.
- *G06F 1/04* (2006.01)
- *G01R 31/317* (2006.01)
- *H03L 7/081* (2006.01)
- *H03L 7/099* (2006.01)
- *H03L 7/089* (2006.01)

(52) U.S. Cl.
CPC ............ *G06F 1/04* (2013.01); *G01R 31/31709* (2013.01); *H03L 7/0812* (2013.01); *H03L 7/0995* (2013.01); *H03L 7/0891* (2013.01)
USPC ........................................................ 708/271

(58) Field of Classification Search
USPC ........................................................ 708/271
See application file for complete search history.

(56) References Cited

U.S. PATENT DOCUMENTS

| | | | |
|---|---|---|---|
| 6,791,379 B1 * | 9/2004 | Wakayama et al. | 327/156 |
| 6,803,826 B2 | 10/2004 | Gomm | |
| 6,986,700 B2 | 1/2006 | Agarwal | |
| 2003/0093715 A1 | 5/2003 | Hasako et al. | |
| 2005/0271161 A1 * | 12/2005 | Staszewki et al. | 375/308 |
| 2006/0285584 A1 * | 12/2006 | Baumgartner et al. | 375/226 |
| 2008/0225055 A1 | 9/2008 | Yu et al. | |

FOREIGN PATENT DOCUMENTS

| CN | 1586083 | 2/2005 |
|---|---|---|
| CN | 1664956 | 9/2005 |
| CN | 101267494 | 9/2008 |

OTHER PUBLICATIONS

CN Application dated Sep. 26, 2011.
CN Divisional Application dated Oct. 31, 2012.

* cited by examiner

*Primary Examiner* — Henry Tsai
*Assistant Examiner* — Dean Phan
(74) *Attorney, Agent, or Firm* — McClure, Qualey & Rodack, LLP (57) ABSTRACT

A jitter generator for generating a jittered clock signal, includes a jitter control signal generator and a jittered clock generator. The jitter control signal generator is utilized for selecting a digital control code from a plurality of candidate digital control codes at individual time points and respectively outputting a plurality of selected digital control codes. The jittered clock generator is coupled to the jitter control signal generator, and utilized for generating the jittered clock signal. The jittered clock generator dynamically adjusts the jittered clock signal according to the plurality of different digital control codes.

1 Claim, 11 Drawing Sheets

JITTER GENERATOR FOR GENERATING JITTERED CLOCK SIGNAL

BACKGROUND OF THE INVENTION

1. Field of the Invention

The present invention relates to a jitter generator, and more particularly, to a jitter generator capable of generating a jittered clock signal for being utilized for built-in-self-test (BIST) of a chip.

2. Description of the Prior Art

In digital communication systems, the tolerance ability of a receiver with respect to timing jitter is an important parameter for evaluating the overall system performance, especially in high-speed communication systems. So-called timing jitter means the appearance of a shift of a rising/falling edge of a data signal or a clock signal (that is, phase shift), causing an increased bit error rate (BER) of the receiver. The conventional solutions usually reduce the effect of jitter in the receiver by utilizing a clock and data recovery (CDR) circuit of the receiver.

Therefore, how to test the jitter tolerance of a receiver is always an important topic. A common test method for the conventional architecture comprises utilizing a jitter generator to generate a clock signal having timing jitter, and inputting a series of random test data bits into a D-type flip-flop, where the D-type flip-flop is triggered by the clock signal having timing jitter to operate. In this way, the D-type flip-flop is capable of outputting a series of data bits having timing jitter. Then the data bit stream having timing jitter is input into the receiver. By comparing the input and output test data bit streams, the jitter tolerance of the receiver can be derived.

However, a good jitter generator must be capable of controlling the jitter frequency and the magnitude of the jitter amplitude, where the jitter amplitude represents the amount of the phase shift of the data signal or the clock signal, and the jitter frequency is the times of generating a phase shift. Although on the current market, there are plenty of off-the-rack test instruments that may satisfy this demand, these test instruments, however, are very expensive and not suitable for being tested in mass production. Another prior art solution utilizes a signal generator and a mixer to modulate a clock signal having timing jitter, where the cost of this solution is lower.

SUMMARY OF THE INVENTION

It is therefore an objective of the present invention to provide a jitter generator that can be utilized for built-in-self-test (BIST) of a chip, in order to save the test instrument cost during testing in a mass production phase.

According to an embodiment of the present invention, a jitter generator for generating a jittered clock signal is disclosed. The jitter generator comprises a jitter control signal generator and a jittered clock generator. The jitter control signal generator is utilized for selecting a digital control code from a plurality of candidate digital control codes at individual time points and respectively outputting a plurality of selected digital control codes; and the jittered clock generator is coupled to the jitter control signal generator, and utilized for generating the jittered clock signal, where the jittered clock generator dynamically adjusts the jittered clock signal according to the plurality of different digital control codes.

According to another embodiment of the present invention, a jitter generator for generating a jittered clock signal is disclosed. The jitter generator comprises a jitter control signal generator and a jittered clock generator. The jitter control signal generator is utilized for generating a jitter control signal; and the jittered clock generator is coupled to the jitter control signal generator, and comprises a clock locking circuit for performing a clock locking operation according to a input clock signal and a feedback clock signal to generate the feedback clock signal at a first node and generate the jittered clock signal at a second node.

DETAILED DESCRIPTION

Figure 1:
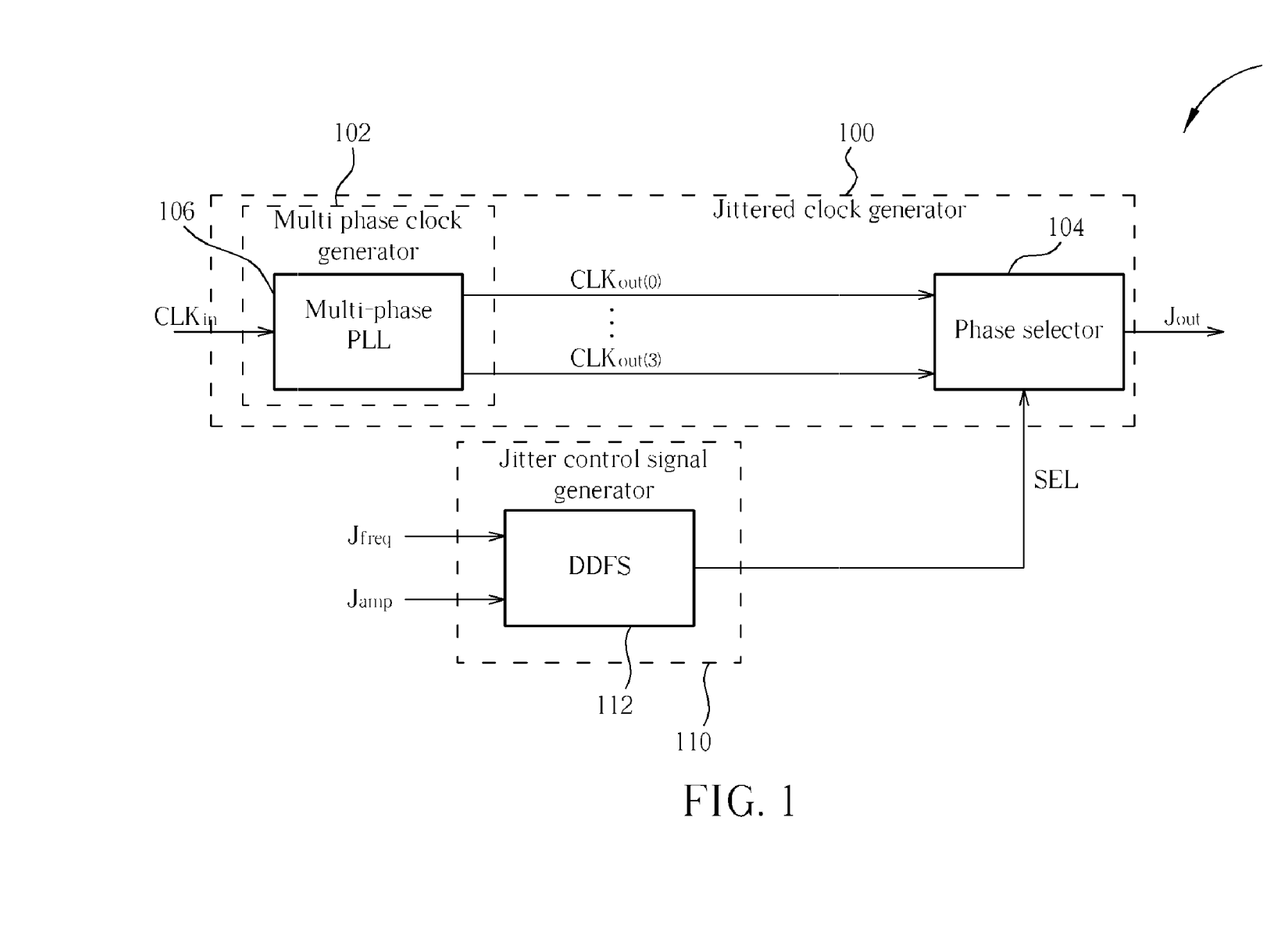
FIG. 1 is a block diagram of a jitter generator according to a first embodiment of the present invention.
Figure 2:
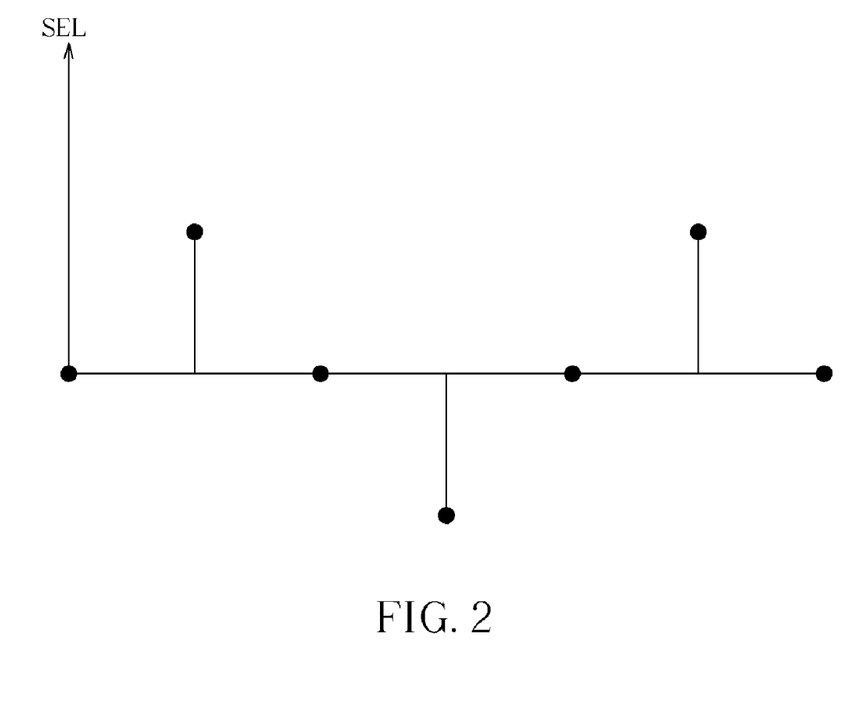
FIG. 2 is a diagram of a digital control code outputted by the jitter control signal generator shown in FIG. 1.
Figure 3:
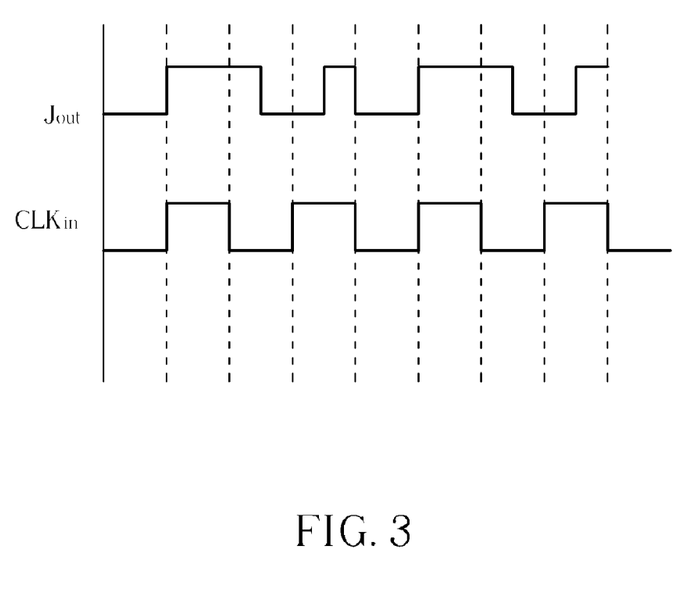
FIG. 3 is a diagram of a jittered clock signal outputted by the jitter generator shown in FIG. 1.
Figure 4:
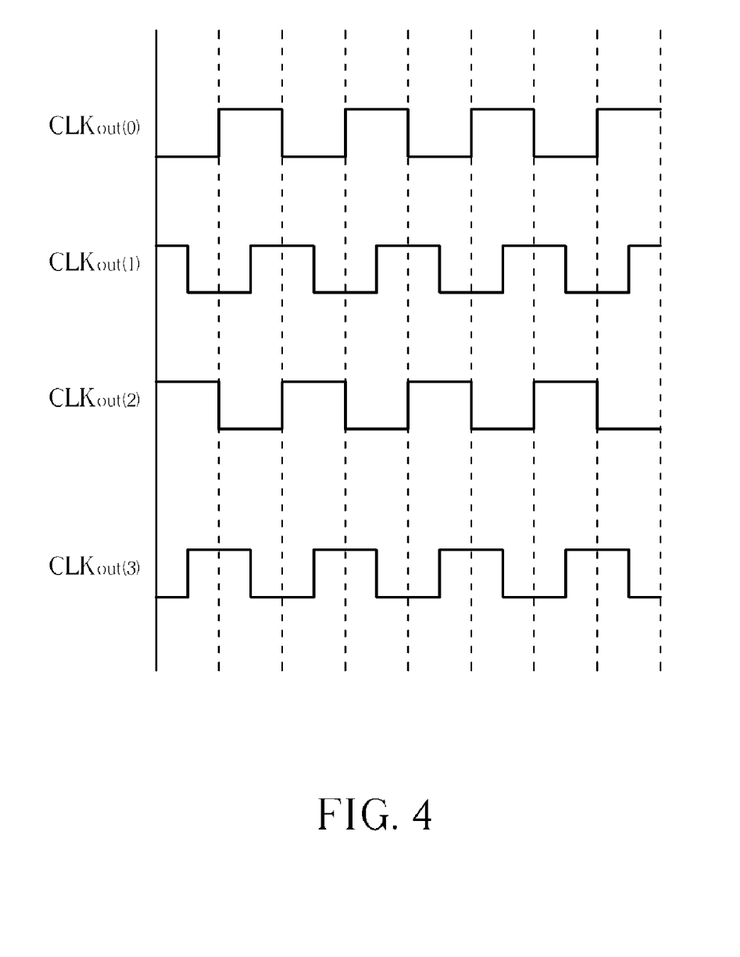
FIG. 4 is a diagram of a plurality of output clock signals having a same frequency and different phases, where the plurality of output clock signals are outputted by the multi-phase clock generator shown in FIG. 1.

Please refer to FIG. 1. FIG. 1 is a block diagram of a jitter generator 10 according to a first embodiment of the present invention. The jitter generator 10 includes a jittered clock generator 100 and a jitter control signal generator 110, and the jittered clock generator 100 comprises a multi-phase clock generator 102 and a phase selector 104. The jitter control signal generator 110 is utilized for selecting at least a set of digital control codes from a plurality of candidate digital control codes at individual time points and respectively outputting a plurality of selected digital control codes. In this embodiment, the jitter control signal generator 110 is implemented with a direct digital frequency synthesizer (DDFS) 112. The DDFS 112 is a component for generating digitalized arbitrary waveforms, where the operation thereof is well known in the art and therefore not explained in detail here. According to the jitter frequency control signal $J_{freq}$ and the jitter amplitude control signal $J_{amp}$, the DDFS 112 is controlled to sequentially generate the digital wave signal needed, where the digital wave signal is utilized as the digital control code SEL (as shown in FIG. 2). The jittered clock generator 100 is utilized for generating the jittered clock signal $J_{out}$, and dynamically adjusting the jittered clock signal $J_{out}$ according to the digital control code SEL (as shown in FIG. 3). In this embodiment, the jittered clock generator 100 includes the multi-phase clock generator 102 and the phase selector 104, wherein the multi-phase clock generator 102 generates a plurality of candidate output clock signals $CLK_{out(n)}$ according to the input clock signal $CLK_{in}$, where the candidate output clock signals $CLK_{out(n)}$ are clock signals with same frequency and different phases. In this embodiment, n=0–3, that is, four clock signals with different phases can be generated, as shown in FIG. 4. In this embodiment, the multi-phase clock generator 102 is implemented with a multi-phase phase locked loop (multi-phase PLL) 106. Please note, this is only for illustrative purposes and not a limitation of the prevent invention. That is, any circuit capable of generating multiple clock signals having a same frequency and different phases can be utilized for implementing the multi-phase clock generator 102 needed. The phase selector 104 is coupled to the multi-phase clock generator 102 and the jitter control signal generator 110, and utilized for selecting a specific output clock signal from n candidate output clock signals $CLK_{out(n)}$ according to the digital control code SEL outputted from the jitter control signal generator 110 to generate the jittered clock signal $J_{out}$. The DDFS 112 generates the digital signal having different amplitudes at individual time points, that is, the DDFS 112 outputs different code contents of the digital control code SEL. As a result, the phases of the output clock signals selected by the phase selector 104 at individual time points are not all the same, and therefore, the jittered clock signal $J_{out}$ having timing jitter is generated (as shown in FIG. 3).

Figure 5:
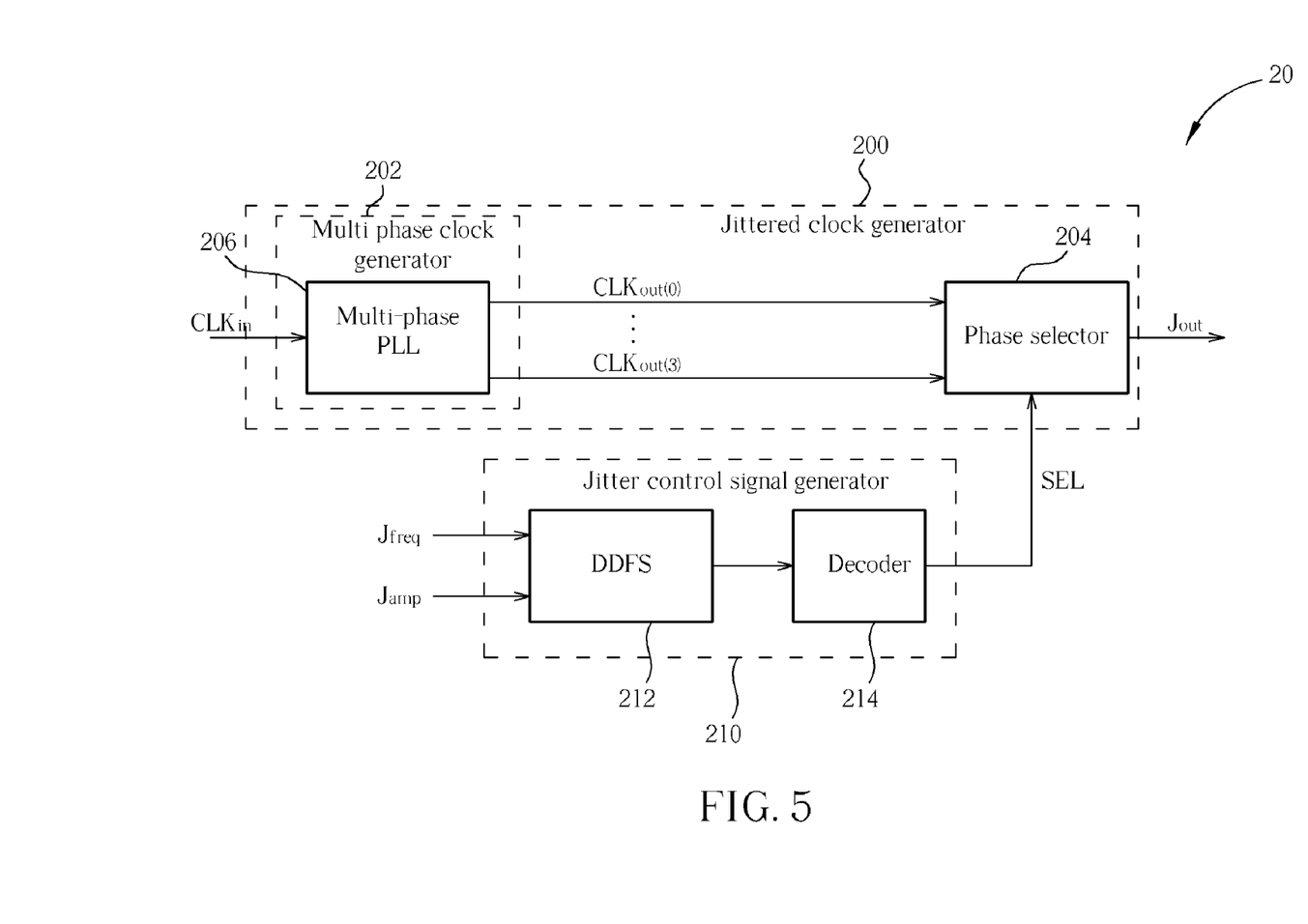
FIG. 5 is a block diagram of a jitter generator according to a second embodiment of the present invention.

Please refer to FIG. 5. FIG. 5 is a block diagram of a jitter generator 20 according to a second embodiment of the present invention. The jitter generator 20 includes a jittered clock generator 200 and a jitter control signal generator 210, where the jittered clock generator 200 includes a multi-phase clock generator 202 and a phase selector 204, and the jitter control signal generator 210 includes a DDFS 212 and a decoder 214. The architecture of the circuit in FIG. 5 is almost the same as FIG. 1, where the only difference is that the jitter control signal generator 210 includes a decoder 214, where the decoder 214 is utilized for decoding and converting the digital wave signal outputted from the DDFS 212 into the digital control code SEL.

Please note that, the aforementioned implementation of the jitter control signal generators respectively disclosed in the first embodiment and the second embodiment is for illustrative purposes only and not a limitation of the present invention. Therefore, some other implementation approaches for generating the jitter control signal according to the jitter frequency control signal $J_{freq}$ and the jitter amplitude control signal $J_{amp}$ may be involved in other embodiments of the present invention.

Figure 6:
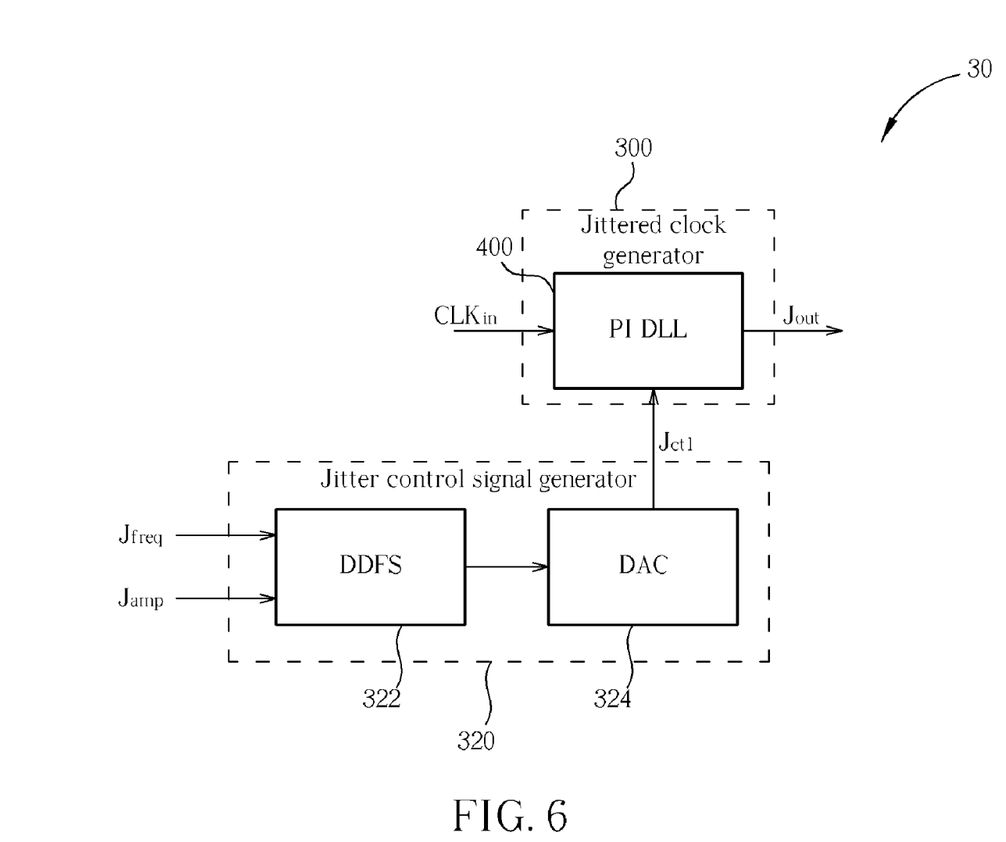
FIG. 6 is a block diagram of a jitter generator according to a third embodiment of the present invention.

Please refer to FIG. 6. FIG. 6 is a block diagram of a jitter generator 30 according to a third embodiment of the present invention. The jitter generator 30 includes a jitter control signal generator 320 for generating a jitter control signal $J_{ctl}$ and a jittered clock generator 300 for generating the jittered clock signal $J_{out}$ according to the jitter control signal $J_{ctl}$. In this embodiment, the jitter control signal generator 320 includes a DDFS 322 and a digital-to-analog converter (DAC) 324. The DDFS 322 can be controlled to synthesize the digital wave signal needed according to the jitter frequency control signal $J_{freq}$ and the jitter amplitude control signal $J_{amp}$, and the DAC 324 converts the digital wave signal to output a jitter control signal $J_{ctl}$ having continuous waveforms, that is, the jitter control signal $J_{ctl}$ is an analog signal.

Figure 7:
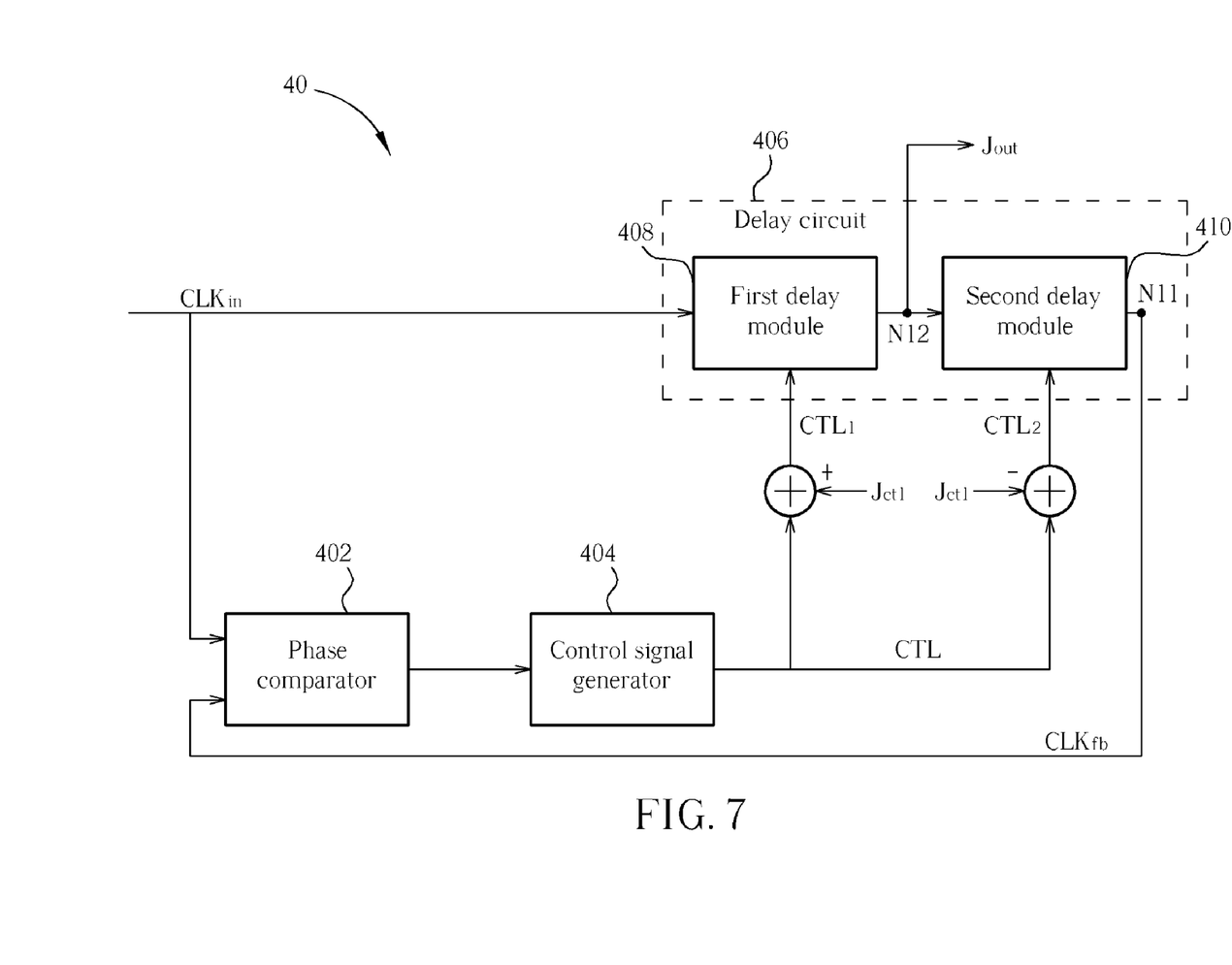
FIG. 7 is a block diagram of the PI DLL shown in FIG. 6.

In this embodiment, the jittered clock generator 300 is implemented with the phase interpolated delay locked loop (PI DLL) 400. Please refer to FIG. 7. FIG. 7 is a block diagram of the PI DLL 400 shown in FIG. 7. The PI DLL 400 is a clock locking circuit for performing a clock locking operation according to the input clock signal $CLK_{in}$ and the feedback clock signal $CLK_{fb}$ to generate the feedback clock signal $CLK_{fb}$ and the jittered clock signal $J_{out}$. The PI DLL 400 includes a phase comparator 402 for generating a comparison result according to the input clock signal $CLK_{in}$ and the feedback clock signal $CLK_{fb}$, a control signal generator 404 (which is coupled to the phase comparator 402) for generating a control signal CTL according to the comparison result, and a delay circuit 406 (which is coupled to the phase comparator 402 and the control signal generator 404) for processing the input clock signal $CLK_{in}$ to generate the feedback clock signal $CLK_{fb}$. As shown in this figure, the delay circuit 406 includes a first delay module 408 for generating the jittered clock signal $J_{out}$ according to the first delay amount control signal $CTL_1$, and a second delay module 410 for generating the feedback clock signal $CLK_{fb}$ according to the second delay amount control signal $CTL_2$. In this embodiment, each delay module is implemented with a voltage control delay line (VCDL). The implementation details of utilizing the DLL to perform the clock locking operation are well known in the art and therefore not explained here. It should be noted that, regarding the difference between the first delay amount control signal $CTL_1$ and the second delay amount control signal $CTL_2$, one of the delay amount control signals is derived by adding the control signal CTL and the jitter control signal $J_{ctl}$, and the other of the delay amount control signals is derived by subtracting the jitter control signal $J_{ctl}$ from the control signal CTL. Thus, the addition and subtraction operations of the same amount causes the resultant effect of the combination of the first delay module 408 and the second delay module 410 to be equivalent to the resultant effect of a delay module controlling the delay amount according to the control signal CTL. Therefore, the two delay modules of the delay circuit 406 do not change the original function of the clock locking operation of the PI DLL. Finally, the phase of the feedback clock signal $CLK_{fb}$ derived from the clock locking operation is still the same as the phase of the input clock signal $CLK_{in}$. However, the jittered clock signal $J_{out}$ outputted from a node N12 between the first delay module 408 and the second delay module 410 and the feedback clock signal $CLK_{fb}$ outputted from a node N11 have the same frequency and different phases. The jitter control signal $J_{ctl}$ is a continuous wave signal with constantly changing amplitudes, so that the delay amount generated by the first delay module 408 changes constantly, meaning the phase difference between the jittered clock signal $J_{out}$ and the input clock signal $CLK_{in}$ changes constantly. As a result, the jittered clock signal $J_{out}$ has the effect of timing jitter. It should also be noted, in an embodiment, the control signal generator 404 can be implemented with a charge pump and a low-pass filter.

Figure 8:
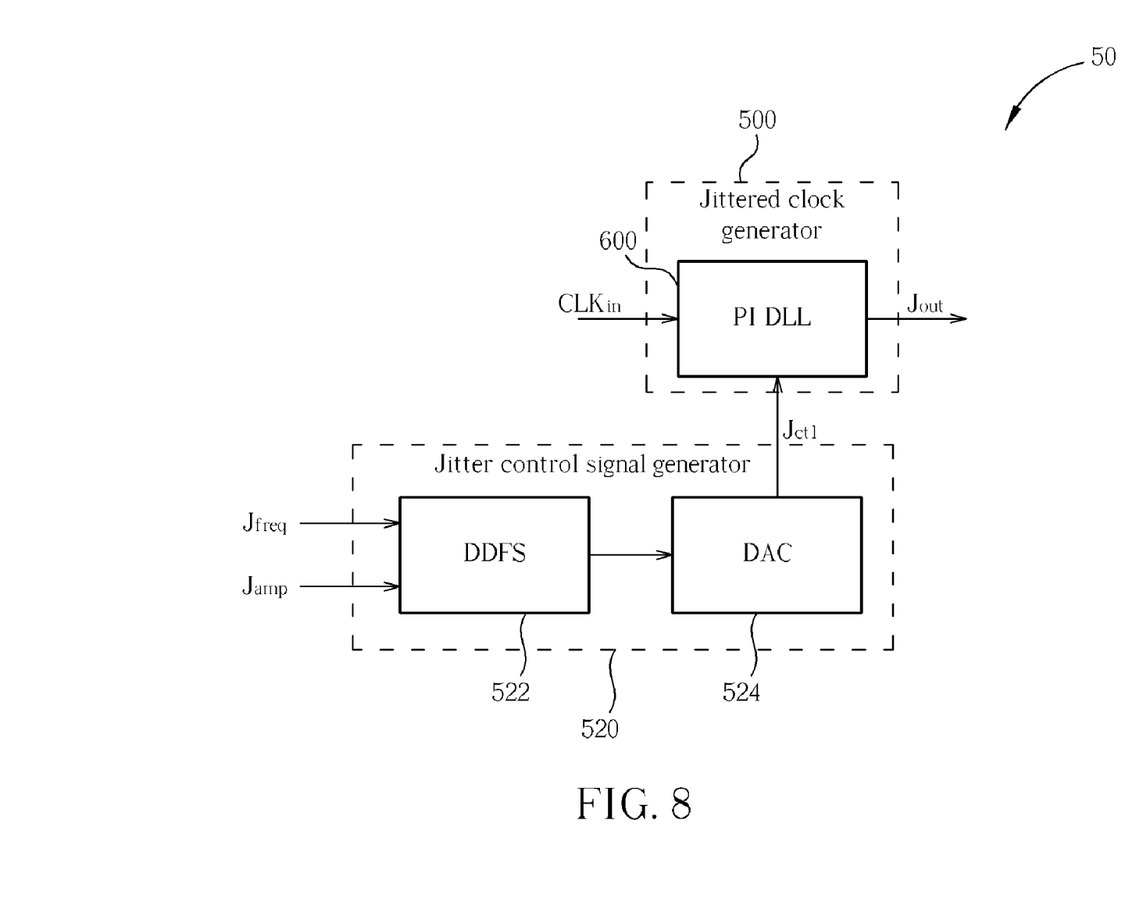
FIG. 8 is a block diagram of a jitter generator according to a fourth embodiment of the present invention.
Figure 9:
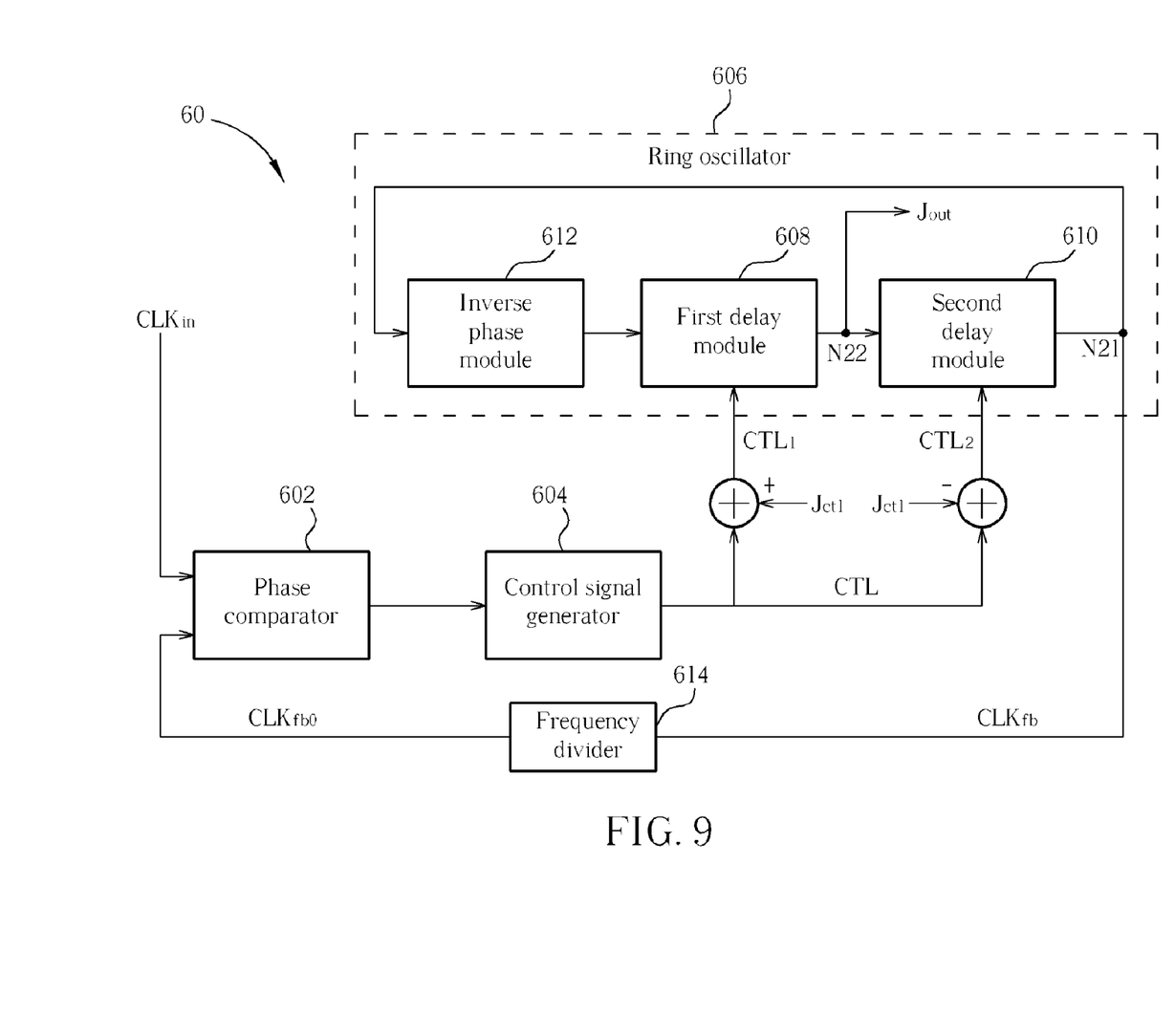
FIG. 9 is a block diagram of the PI PLL shown in FIG. 8.

Please refer to FIG. 8. FIG. 8 is a block diagram of a jitter generator 50 according to a fourth embodiment of the present invention. Comparing FIG. 8 with FIG. 6, the circuitries in respective figures are similar, where the only difference is that the jittered clock generator 500 is implemented with a phase interpolated phase-locked loop (PI PLL) 600. Please refer to FIG. 9. FIG. 9 is a block diagram of the PI PLL 600 shown in FIG. 8. The PI PLL 600 is also a clock locking circuit, and includes a phase comparator 602 for generating a comparison result according to the input clock signal $CLK_{in}$ and the feedback clock signal $CLK_{fb0}$, a control signal generator 604 (which is coupled to the phase comparator 602) for generating the control signal CTL according to the comparison result, and a ring oscillator 606 (which is coupled to the phase comparator 602 and the control signal generator 604) for generating the feedback clock signal $CLK_{fb}$. The PI PLL 600 further includes a frequency divider 614 for performing a frequency dividing operation on the feedback clock signal $CLK_{fb}$ and outputting the feedback clock signal $CLK_{fb0}$, so that the frequencies of the two feedback clock signals have a multiple relationship, and the input clock signal $CLK_{in}$ and the feedback clock signal $CLK_{fb0}$ also have a multiple relationship. Besides, the ring oscillator 606 includes a phase inversion module 612, a first delay module 608 for generating the jittered clock signal $J_{out}$ according to the first delay amount control signal $CTL_1$, and a second delay module 610 for generating the feedback clock signal $CLK_{fb}$ according to the second delay amount control signal $CTL_2$. In this embodiment, each delay module is implemented with a VCDL. The implementation details of utilizing the PI PLL to perform the clock locking operation are well known in the art and therefore not explained here. It should be noted that, regarding the difference between the first delay amount control signal $CTL_1$ and the second delay amount control signal $CTL_2$ in this embodiment, one of the delay amount control signals is derived by adding the control signal CTL and the jitter control signal $J_{ctl}$, and the other of the delay amount control signals is derived by subtracting the jitter control signal $J_{ctl}$ from the control signal CTL. Thus, the addition and subtraction operations of the same amount causes the resultant effect of the combination of the first delay module 608 and the second delay module 610 to be equivalent to the resultant effect of a delay module controlling the delay amount according to the control signal CTL. Therefore, the two delay modules of the delay circuit 606 do not change the original function of the clock locking operation of the PI PLL. However, the jittered clock signal $J_{out}$ outputted from a node N22 between the first delay module 608 and the second delay module 610 and the feedback clock signal $CLK_{fb}$ outputted from a node N21 have the same frequency and different phases. The jitter control signal $J_{ctl}$ is a continuous wave signal with constantly changing amplitudes, so that the delay amount generated by the first delay module 608 changes constantly, meaning the phase difference between the jittered clock signal $J_{out}$ and the input clock signal $CLK_{in}$ changes constantly. As a result, the jittered clock signal $J_{out}$ has the effect of timing jitter.

Besides, in the third embodiment of the present invention, the amount of jitter that can be generated by utilizing the PI PLL substantially ranges from −0.5 unit interval (UI) to +0.5 UI. This is because when the PI DLL 400 locks the phase of the input clock signal $CLK_{in}$, the difference of the delay amount between the feedback clock signal $CLK_{fb}$ outputted though the two stages of VCDLs and the input clock signal $CLK_{in}$ is just 1 period. As shown in FIG. 9, in the fourth embodiment of the present invention, the PI DLL of the third embodiment of the present invention is replaced with the PI PLL. Although their functions are the same, the jitter amplitude generated in this embodiment will not be limited to be within a UI. The PI PLL 600 has the frequency divider 614, allowing the frequency of the input clock signal $CLK_{in}$ to be a multiple of that of the feedback clock signal $CLK_{fb}$, and therefore, the amount of jitter generated by the jittered clock signal $J_{out}$ can exceed one UI.

Figure 10:
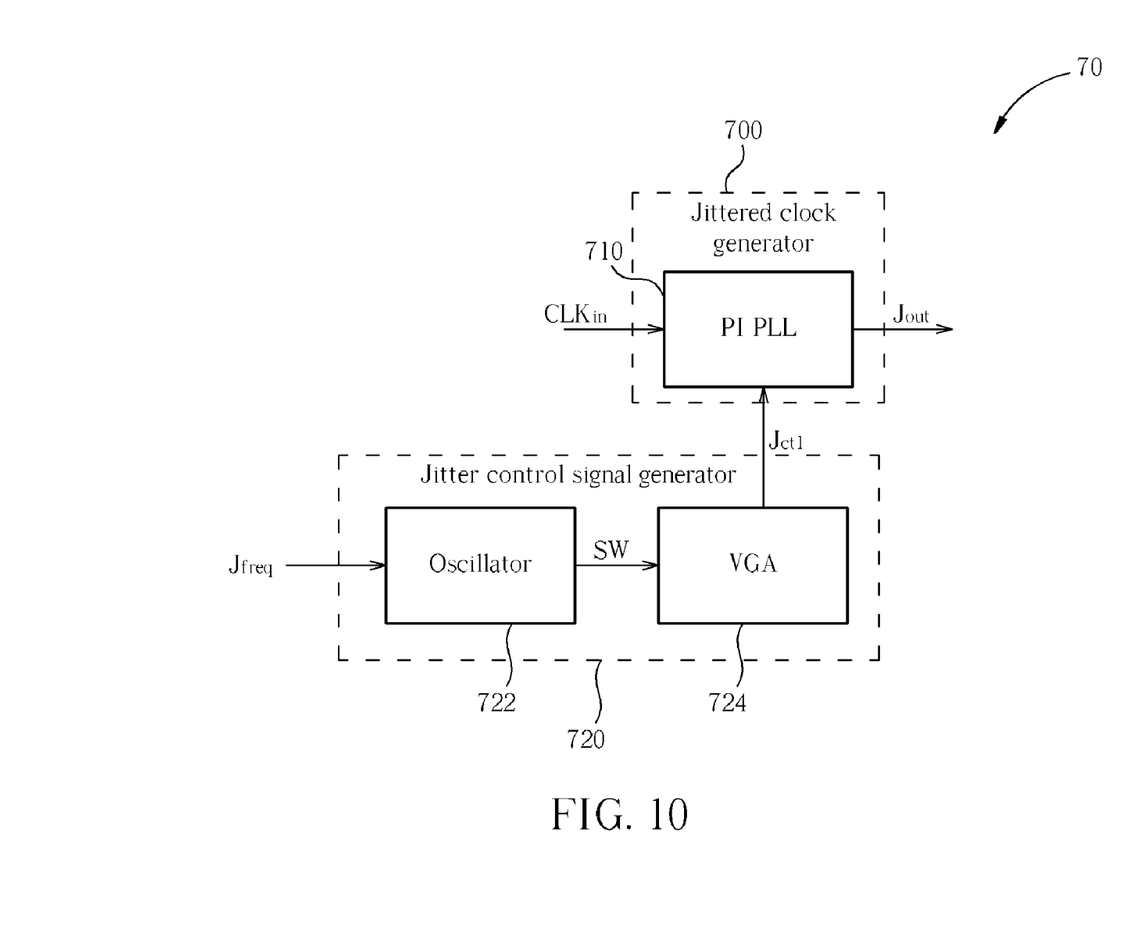
FIG. 10 is a block diagram of a jitter generator according to a fifth embodiment of the present invention.

Please refer to FIG. 10. FIG. 10 is a block diagram of a jitter generator 70 according to a fifth embodiment of the present invention. Comparing FIG. 10 with FIG. 6, the circuitries in respective figures are almost the same, where the only difference is that the jittered control clock generator 720 shown in FIG. 10 includes an oscillator 722 and a variable gain amplifier (VGA) 724. The oscillator 722 is utilized for generating an oscillation signal SW according to the jitter frequency control signal $J_{freq}$, and the VGA 724 is coupled to the oscillator 722 and utilized for converting the oscillation signal SW into the jitter control signal $J_{ctl}$ according to the jitter amplitude control signal $J_{amp}$. The jitter control signal $J_{ctl}$ generated in this embodiment is the same as the jitter control signal $J_{ctl}$ generated in the third embodiment shown in FIG. 6, and is a continuous wave signal with constantly changing amplitudes and is capable of controlling the PI DLL 710 to generate the amplitude signal having the timing jitter.

Figure 11:
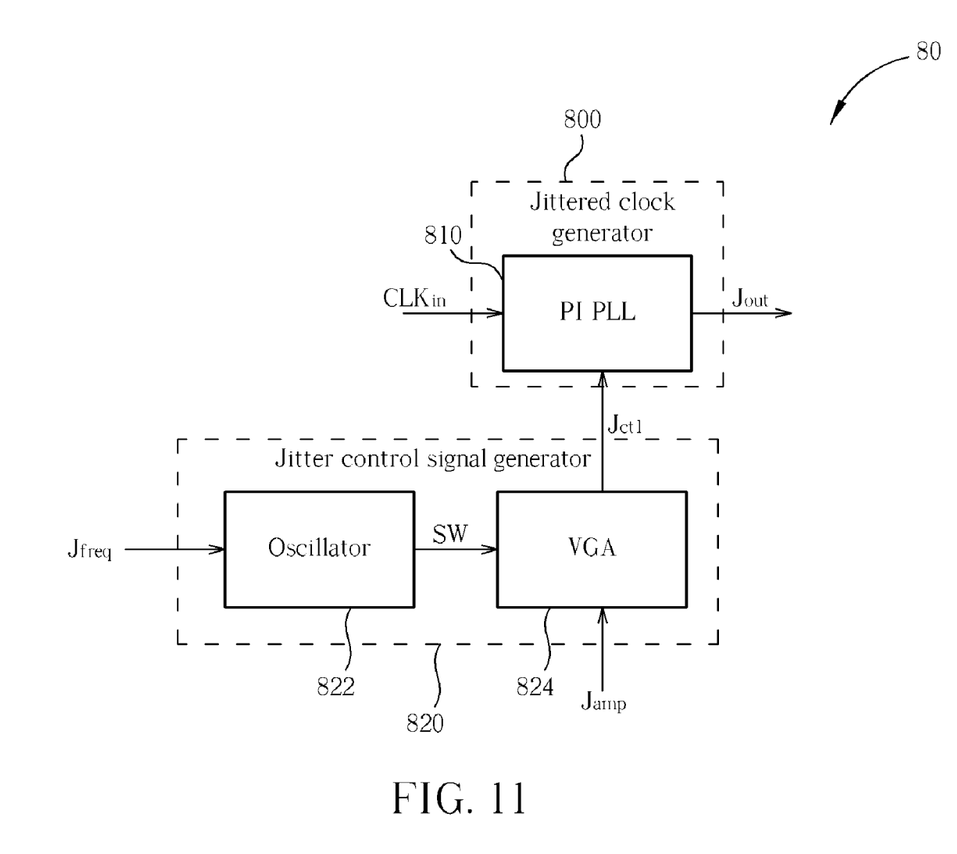
FIG. 11 is a block diagram of a jitter generator according to a sixth embodiment of the present invention.

Please refer to FIG. 11. FIG. 11 is a block diagram of a jitter generator 80 according to a sixth embodiment of the present invention. Comparing FIG. 11 with FIG. 10, the circuitries in respective figures are similar, where the only difference is that the jittered clock generator 800 shown in FIG. 11 is implemented with the PI PLL 810. The PI PLL 810 of FIG. 11 is the same as the PI PLL 600 of FIG. 9, and the Jitter control signal generator 820 is the same as the Jitter control signal generator 720 of FIG. 10, so operations of this embodiment are not explained in detail here.

The jitter circuit disclosed in this invention is suitable for being implemented on a chip to realize the aforementioned built-in-self-test (BIST), in order to save the test instrument cost during testing in a mass production phase. If the chip has a transmitter circuit, a portion of hardware circuit (e.g. multi-phase PLL, PI DLL, or PI PLL) utilized in the transmitter can be further utilized during the BIST. As a result, the chip area is decreased and therefore the production cost is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A jitter generator for generating a jittered clock signal, the jitter generator comprising:
   a jitter control signal generator configured to select a digital control code from a plurality of candidate digital control codes at individual time points, each of the plurality of candidate digital control codes comprising a digitized arbitrary waveform, and outputting the selected digital control code, the selected digital control code comprising a sequence of consecutively different amplitudes at different time points, wherein the jitter control signal generator comprises:
      a direct digital frequency synthesizer (DDFS), configured to generate the digital control code according to a jitter frequency control signal and a jitter amplitude control signal, and
      a decoder, coupled to the DDFS, configured to decode an output of the DDFS to generate the digital control code;
   a jittered clock generator, coupled to the jitter control signal generator, configured to deterministically generate the jittered clock signal, wherein the jittered clock generator dynamically provides the jittered clock signal according to the selected digital control code, the generated jittered clock signal comprising jitter over a plurality of contiguous clock cycles, wherein the jittered clock generator comprises:
      a multi-phase clock generator, configured to generate a plurality of candidate output clock signals according to an input clock signal wherein the candidate output clock signals have identical frequency and diverse phases; and
      a phase selector, coupled to the multi-phase clock generator and the phase control signal generator, configured to concurrently receive the plurality of candidate output clock signals and select a respective one of the candidate output clock signals according to the respective different time points to generate the jittered clock signal.

* * * * *